(12) United States Patent
Peng et al.

(10) Patent No.: US 12,388,013 B2
(45) Date of Patent: Aug. 12, 2025

(54) THREE DIMENSIONAL INTEGRATED CIRCUIT WITH MONOLITHIC INTER-TIER VIAS (MIV)

(71) Applicant: Taiwan Semiconductor Manufacturing Company, Ltd., Hsinchu (TW)

(72) Inventors: Shih-Wei Peng, Hsinchu (TW); Jiann-Tyng Tzeng, Hsin Chu (TW); Kam-Tou Sio, Zhubei (TW); Wei-Cheng Lin, Taichung (TW); Wei-An Lai, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/447,739

(22) Filed: Aug. 10, 2023

(65) Prior Publication Data
US 2024/0055348 A1  Feb. 15, 2024

Related U.S. Application Data

(62) Division of application No. 17/237,443, filed on Apr. 22, 2021, now Pat. No. 11,769,723.

(51) Int. Cl.
*H01L 23/522* (2006.01)
*H01L 23/528* (2006.01)
*H10D 88/00* (2025.01)
*H10D 89/10* (2025.01)

(52) U.S. Cl.
CPC ...... *H01L 23/5226* (2013.01); *H01L 23/5283* (2013.01); *H10D 88/00* (2025.01); *H10D 89/10* (2025.01)

(58) Field of Classification Search
CPC ............. H01L 23/5226; H01L 23/5283; H01L 27/0207; H01L 27/0688; H10D 88/00; H10D 89/10
USPC ...................................................... 257/774
See application file for complete search history.

(56) References Cited

U.S. PATENT DOCUMENTS

| | | | |
|---|---|---|---|
| 9,685,436 B2 | 6/2017 | Morrow et al. | |
| 10,170,404 B2 | 1/2019 | Guo et al. | |
| 10,593,681 B1 | 3/2020 | Rubin | |
| 11,769,723 B2 | 9/2023 | Peng et al. | |
| 2021/0193655 A1* | 6/2021 | Or-Bach | H01L 21/823475 |
| 2022/0271033 A1* | 8/2022 | Chanemougame | H01L 21/0259 |

* cited by examiner

*Primary Examiner* — Tu-Tu V Ho
(74) *Attorney, Agent, or Firm* — Merchant & Gould P.C.

(57) ABSTRACT

A monolithic three-dimensional (3D) integrated circuit (IC) device includes a lower tier including a lower tier cell and an upper tier arranged over the lower tier. The upper tier has a first upper tier cell and a second upper tier cell separated by a predetermined lateral space. A monolithic inter-tier via (MIV) extends from the lower tier through the predetermined lateral space, and the MIV has a first end electrically connected to the lower tier cell and a second end electrically connected to the first upper tier cell.

20 Claims, 10 Drawing Sheets

THREE DIMENSIONAL INTEGRATED CIRCUIT WITH MONOLITHIC INTER-TIER VIAS (MIV)

CROSS-REFERENCE TO RELATED APPLICATION

This application is a division of U.S. patent application Ser. No. 17/237,443, now U.S. Pat. No. 11,769,723, which is incorporated by reference herein.

BACKGROUND

Historically, elements within an Integrated Circuits (IC) have all been placed in a single two dimensional (2D) active layer with elements interconnected through one or more metal layers that are also within the IC. While such circuits have generally become smaller according to Moore's Law, efforts to miniaturize ICs are reaching their limits in a 2D space and thus, design thoughts have moved to three dimensions. That is, current miniaturization techniques use three-dimensional (3D) integrated circuits (ICs) (3DICs) to achieve higher device packing density, lower interconnect delay, and lower costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

DETAILED DESCRIPTION

Figure 1:
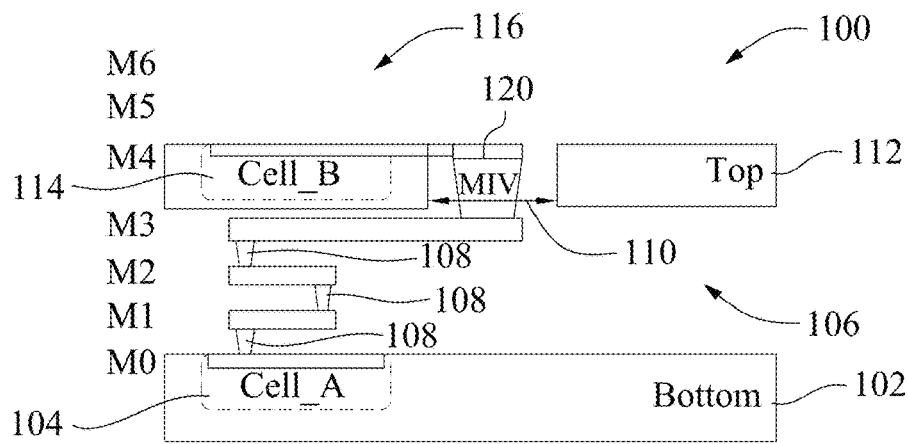
FIG. 1 is a block diagram schematically illustrating an example of a monolithic three-dimensional (3D) integrated circuit (IC) device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Monolithic integrated circuits (IC) generally include a number of transistors, such as metal-oxide-semiconductor field-effect transistors (MOSFETs) fabricated over a planar substrate, such as a silicon wafer. Lateral scaling of IC dimensions is becoming more difficult as MOSFET gate dimensions become smaller and smaller. Three-dimensional (3D) monolithic integration generally allows for the vertical stacking of devices on a single die to reduce die area and increase die performance. More specifically, 3D monolithic integration methods generally allow for components of the devices and their connections to be built within multiple tiers on a single die.

While 3D integration may be achieved at a package level, for example by stacking separately manufactured chips, a monolithic 3D approach provides greater inter-layer interconnect density, allowing 3D circuits to be constructed at the lowest level and the tightest circuit density. In a monolithic 3D IC, two or more device tiers are fabricated sequentially, as opposed than bonding two fabricated dies together using bumps or through-silicon-vias (TSV).

More particularly, monolithic 3D ICs entail two or more levels of devices such as transistors that are sequentially fabricated and interconnected over a substrate. For example, beginning with a first semiconductor substrate, a first level of transistors is fabricated with conventional techniques. A donor substrate is then bonded to the first substrate and a portion of the donor substrate is cleaved off to leave a semiconductor thin film over the first level of transistors. This method is of course only one of many ways to obtain a single crystal substrate for the second layer of devices. A second level of transistors is then fabricated in the semiconductor thin film and inter-level interconnects are formed between the transistor levels.

Thus, monolithic 3D ICs may include one or more inter-level interconnects that extend between a first (e.g., lower) and second (e.g., upper) transistor or device level in the monolithic 3D IC to make vertical connections tiers of the monolithic 3D IC. Sometimes TSVs are used to implement inter-level interconnects. However, size and pitch of typical TSV structures may limit effectiveness of inter-layer interconnects for monolithic 3D ICs.

In accordance with some aspects of the present disclosure, monolithic inter-tier vias (MIVs) provide inter-level interconnects a bottom (or lower) tier cell to top (or upper) tier cell. Disclosed upper tier cell placement and routing patterns, along with specified MIV sizes and shapes may facilitate effective inter-level interconnects for the monolithic 3D ICs. Further, some examples employ 2D electronic design automation (EDA) tools for placement and routing of devices for monolithic 3D ICs. In this manner, layout and fabrication complexity may not be substantially more than for a comparably dimensioned 2D (i.e. single-device-level) IC.

FIG. 1 is a block diagram conceptually illustrating a monolithic 3D IC 100 in accordance with disclosed embodiments. The monolithic 3D IC 100 has a plurality of tiers, each with active components or devices, that are vertically stacked on a single die to reduce die area. More particularly, the monolithic 3D IC 100 shown in FIG. 1 has a lower tier 102 including a lower tier cell 104. An upper tier 112 is arranged over the lower tier 102, and the upper tier 112 has a first upper tier cell 114. A monolithic inter-tier via (MIV) 120 extends from the lower tier 102 through a predetermined space 110 defined in the upper tier 112 to electrically connect the cells 104 and 114. In some embodiments, the space 110 laterally separates two upper tier cells. Further, the pre-defined space in some examples is two poly pitch (2CPP), while other embodiments use a 3CPP or other desired spacing to facilitate placement of the MIV 120. Thus, the 2D space for the upper tier 112 is constrained based on the number and size of the spaces 110 provided for placement of one or more MIVs 120, which may result in the upper tier 112 including fewer cells 114 than the lower tier 102. The upper tier space constraint is discussed further below.

The illustrated example has two tiers 102 and 112, though other embodiments could have additional tiers. Further, for ease of illustration the monolithic 3D IC of FIG. 1 includes only the cells 104 and 114. As will discussed further below, typical implementations will have many of the lower tier cells and upper tier cells in addition to the cells 104 and 114.

The lower tier 102 includes a lower tier multi-layer interconnect (MLI) structure 106, and the upper tier 112 has an upper tier MLI structure 116. The MLI structures 106 and 116 may include conductive lines, conductive vertical interconnect accesses (vias), and/or interposing dielectric layers (e.g., interlayer dielectric (ILD) layers). More specifically, the illustrated example MLI structures 106 and 116 each include a plurality of metal layers. The example lower tier MLI structure 106 includes metal layers M0-M3, and the example upper tier MLI structure 116 includes metal layers M4-M6. The lower tier MLI structure 106 further includes lower tier local vias 108 that interconnect various lower tier metal layers M0-M3 within the lower tier 102.

The MLI structures 106 and 116 may provide various physical and electrical connections within their respective tiers 102 and 112, while one or more of the MIVs 120 provide inter-tier electrical connections between the lower tier 102 and upper tier 112. The metal layers M0-M6 may comprise copper, aluminum, tungsten, tantalum, titanium, nickel, cobalt, metal silicide, metal nitride, poly silicon, combinations thereof, and/or other materials possibly including one or more layers or linings. Interposing dielectric layers (e.g., ILD layers) may comprise silicon dioxide, fluorinated silicon glass (FGS), SILK (a product of Dow Chemical of Michigan), BLACK DIAMOND (a product of Applied Materials of Santa Clara, Calif.), and/or other suitable insulating materials. The MLI structure may be formed by suitable processes typical in CMOS fabrication such as CVD, PVD, ALD, plating, spin-on coating, and/or other processes.

As noted above, the MIV 120 extends through the pre-determined space 110 defined in the upper tier 112 to electrically connect the cells 104 and 114. In the example illustrated in FIG. 1, a first end of the MIV 120 is electrically connected to the lower tier cell 104 through the lower tier MLI structure 106. More particularly, in the example of FIG. 1 the lower end of the MIV 120 is directly connected to the lower tier metal layer M3, which is connected to the lower tier cell 104 through one or more of the metal layers M0-M2 and the local vias 108.

Figure 2:
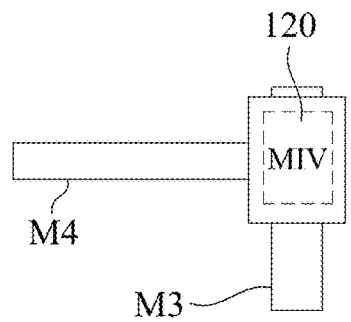
FIG. 2 is a top view illustrating a portion of the monolithic 3D IC device of FIG. 1.

Further, the upper end of the MIV 120 is connected to the first upper tier metal layer M4. FIG. 2 is a top view illustrating the direct connection of the M4 metal layer to the upper end of the MIV 120, with the lower end thereof directly connected to the M3 metal layer of the lower tier 102. As shown in FIG. 2, the M4 metal layer provides a direct electrical connection between the MIV 120 and the cell 114.

Figure 3:
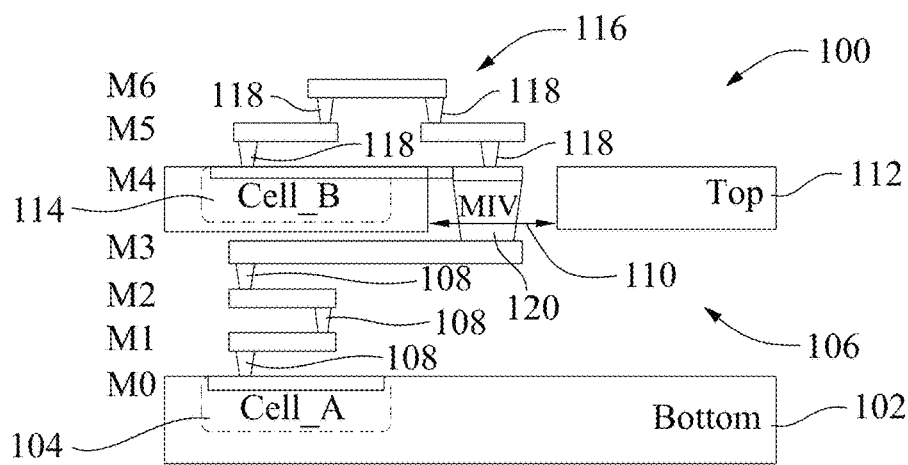
FIG. 3 is a block diagram schematically illustrating another example of a monolithic 3D IC device in accordance with some embodiments.
Figure 4:
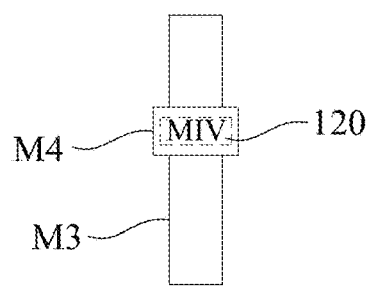
FIG. 4 is a top view illustrating a portion of the monolithic 3D IC device of FIG. 3.

FIG. 3 illustrates another embodiment of a monolithic 3D IC 100 that is similar to the embodiment of FIG. 1. The example of FIG. 3 also includes the lower tier 102 with the lower tier cell 104, as well as the upper tier 112 over the lower tier 102 with the first upper tier cell 114. The MIV 120 extends from the lower tier 102 through the space 110 to electrically connect the cells 104 and 114. The embodiment shown in FIG. 3 has the lower end of the MIV 120 connected to the M3 metal layer of the lower tier as with the monolithic 3D IC 100 of FIG. 1. The metal layer M4 of the upper tier MLI structure 116 in FIG. 3 does not directly connect the MIV to the cell 114. Instead, the MIV is electrically connected to the cell 114 by the upper tier metal layers M5 and M6 and local vias 118, in addition to the M4 metal layer. FIG. 4 is a top view illustrating the connection of the M4 metal layer to the MIV 120, which is further directly connected to the lower tier M3 metal layer. In FIGS. 3 and 4, the M4 metal layer does not directly connect the MIV to the cell 114.

In some examples, an integrated circuit design for the monolithic 3D IC is provided by a computer system such as and Electronic Design Automation (EDA) system. EDA tools and methods facilitate the design, partition, and placement of microelectronic integrated circuits on a semiconductor substrate. This process typically includes turning a behavioral description of the circuit into a functional description, which is then decomposed into logic functions and mapped into cells (e.g. the cells 104 and 114) that implement logic or other electronic functions. Such cells may be defined and stored in a standard cell library. Once mapped, a synthesis is performed to turn the structural design into a physical layout, and the design may be optimized post layout.

Based on the received functional circuit description, standard cells such as the cells 104 and 114 may be selected from the cell library. Generally, transistors are formed into primitive circuits that perform digital logic functions such as AND, OR, NAND, NOR, etc. The primitive circuits are then organized into macro circuits such as multiplexers, adders, multipliers, decoders, etc., which in turn are organized as functional blocks. In a hierarchical design, the functions of the integrated circuit design are allocated space on the semiconductor substrate. Each of the individual functions is then partitioned into the various macro circuits which are often predesigned and placed in the standard cell library of the EDA system.

A general floor plan is determined in which the standard cells, taken from the library of cells, are laid out on the chip real estate. As will be discussed further below, in some disclosed examples a two-dimensional (2D) layout is determined for each tier of the monolithic 3D IC. After the placement of the standard cells is determined, a routing step is performed in which electrical conductors such as the electrical conductors of the MLI structures 106 and 116 are laid out or "routed" on the respective tiers in order to interconnect the electronic modules (i.e. cells) with each other and with peripheral contact pads that are used to connect the IC with external circuitry. More specifically, during circuit layout synthesis, routing typically involves the connection of N-Type and P-Type transistors and signal input/output ports using electrical connections and applicable layers according to the electrical connectivity of the circuit being laid out. The applicable layers for interconnection usually include poly-silicon, diffusion and metal. Moreover, in accordance with some examples, the routing process further includes determining the inter-tier connections using MIVs as described above.

Figure 5:
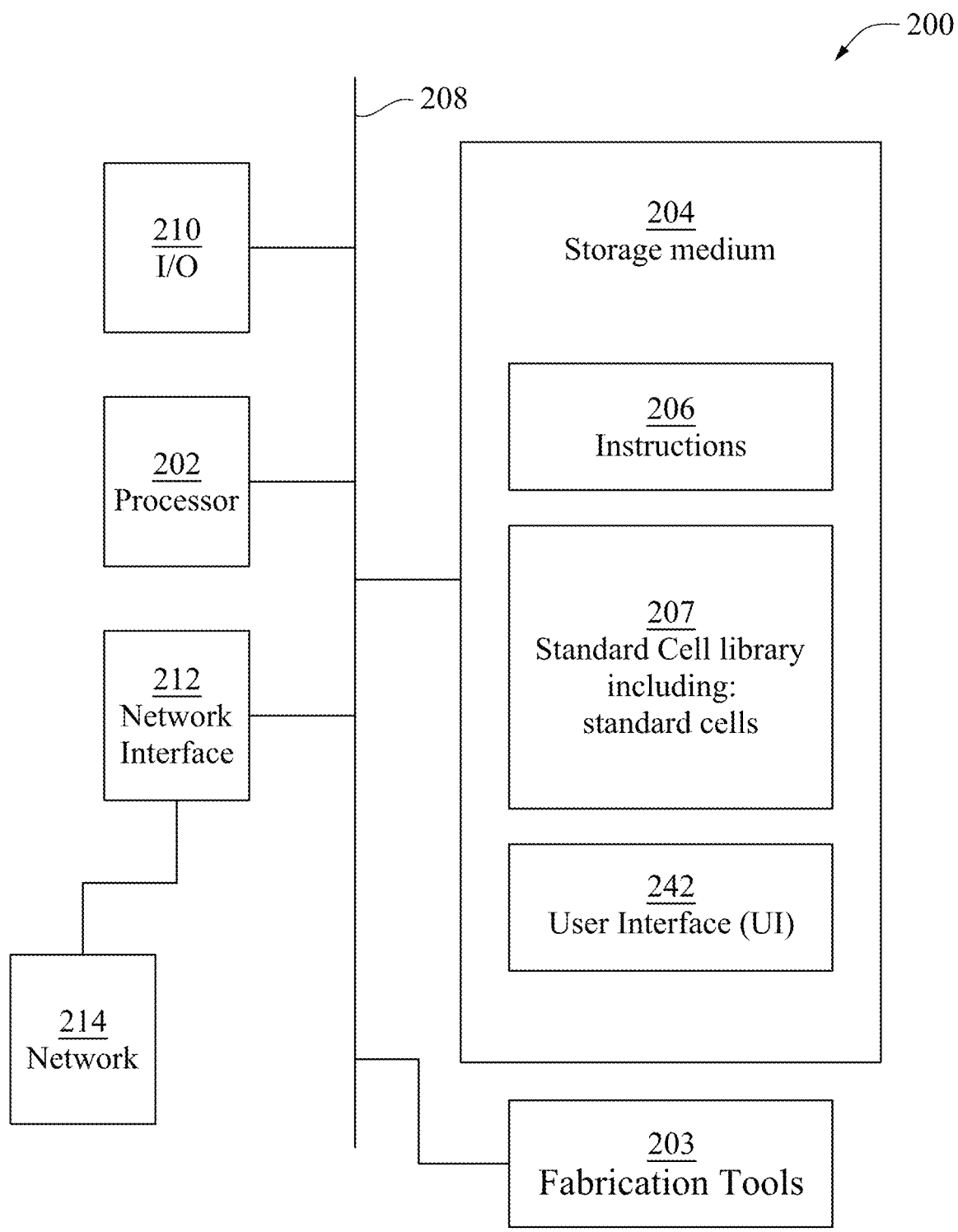
FIG. 5 is a block diagram illustrating an example of a computer system in accordance with some embodiments.

As noted above, the layout process may be implemented by a computer system, such as an EDA system. FIG. 5 is a block diagram illustrating various aspects of an EDA system 200 in accordance with the present disclosure. Some or all of the operations for layout methods disclosed herein are capable of being performed as part of a design procedure performed in a design house, such as the design house 220 discussed below with respect to FIG. 6.

In some embodiments, the EDA system 200 shown in FIG. 5 includes an automated place and route (APR) system. In some embodiments, the EDA system 200 is a general purpose computing device including a processor 202 and a non-transitory, computer-readable storage medium 204. The computer-readable storage medium 204, may be encoded with, for example, stores, computer program code 206, i.e., a set of executable instructions. Execution of instructions 206 by the processor 202 represents (at least in part) an EDA tool which implements a portion or all of, monolithic 3D IC methods described herein (hereinafter, the noted processes and/or methods). Further, fabrication tools 203 may be included for layout and physical implementation of the monolithic 3D IC devices.

The processor 202 is electrically coupled to the computer-readable storage medium 204 via a bus 208. The processor 202 is also electrically coupled to an I/O interface 210 by the bus 208. A network interface 212 is also electrically connected to the processor 202 via the bus 208. The network interface 212 is connected to a network 214, so that the processor 202 and the computer-readable storage medium 204 are capable of connecting to external elements via the network 214. The processor 202 is configured to execute the computer program code 206 encoded in the computer-readable storage medium 204 in order to cause the system 200 to be usable for performing a portion or all of the noted processes and/or methods. In one or more embodiments, the processor 202 is a central processing unit (CPU), a multi-processor, a distributed processing system, an application specific integrated circuit (ASIC), and/or a suitable processing unit.

In one or more embodiments, the computer-readable storage medium 204 is an electronic, magnetic, optical, electromagnetic, infrared, and/or a semiconductor system (or apparatus or device). For example, the computer-readable storage medium 204 includes a semiconductor or solid-state memory, a magnetic tape, a removable computer diskette, a random access memory (RAM), a read-only memory (ROM), a rigid magnetic disk, and/or an optical disk. In one or more embodiments using optical disks, the computer-readable storage medium 204 includes a compact disk-read only memory (CD-ROM), a compact disk-read/write (CD-R/W), and/or a digital video disc (DVD).

In one or more embodiments, the computer-readable storage medium 204 stores computer program code 206 configured to cause the system 200 to be usable for performing a portion or all of the noted processes and/or methods. In one or more embodiments, the computer-readable storage medium 204 also stores information which facilitates performing a portion or all of the noted processes and/or methods. In one or more embodiments, the computer-readable storage medium 204 stores a library 207 of standard cells.

The EDA system 200 includes an I/O interface 210. The I/O interface 210 is coupled to external circuitry. In one or more embodiments, the I/O interface 210 includes a keyboard, keypad, mouse, trackball, trackpad, touchscreen, and/or cursor direction keys for communicating information and commands to the processor 202.

The EDA system 200 also includes a network interface 212 coupled to the processor 202. The network interface 212 allows the system 200 to communicate with the network 214, to which one or more other computer systems are connected. The network interface 212 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 200.

The system 200 is configured to receive information through an I/O interface 210. The information received through the I/O interface 210 includes one or more of instructions, data, design rules, libraries of standard cells, and/or other parameters for processing by processor 202. The information is transferred to the processor 202 via the bus 208. The EDA system 200 is configured to receive information related to a UI through the I/O interface 210. The information is stored in the computer-readable medium 204 as a user interface (UI) 242.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by the EDA system 200. In some embodiments, a layout diagram which includes standard cells is generated using a tool such as VIRTUOSO available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

As noted above, embodiments of the EDA system 200 may include fabrication tools 203 for implementing the processes and/or methods stored in the storage medium 204. For instance, a synthesis ay be performed on a design in which the behavior and/or functions desired from the design are transformed to a functionally equivalent logic gate-level circuit description by matching the design to standard cells selected from the standard cell library 207. The synthesis results in a functionally equivalent logic gate-level circuit description, such as a gate-level netlist. Based on the gate-level netlist, a photolithographic mask may be generated that is used to fabricate the integrated circuit by the fabrication tools 203. Further aspects of device fabrication are disclosed in conjunction with FIG. 6, which is a block diagram of IC manufacturing system 201, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using the manufacturing system 201.

Figure 6:
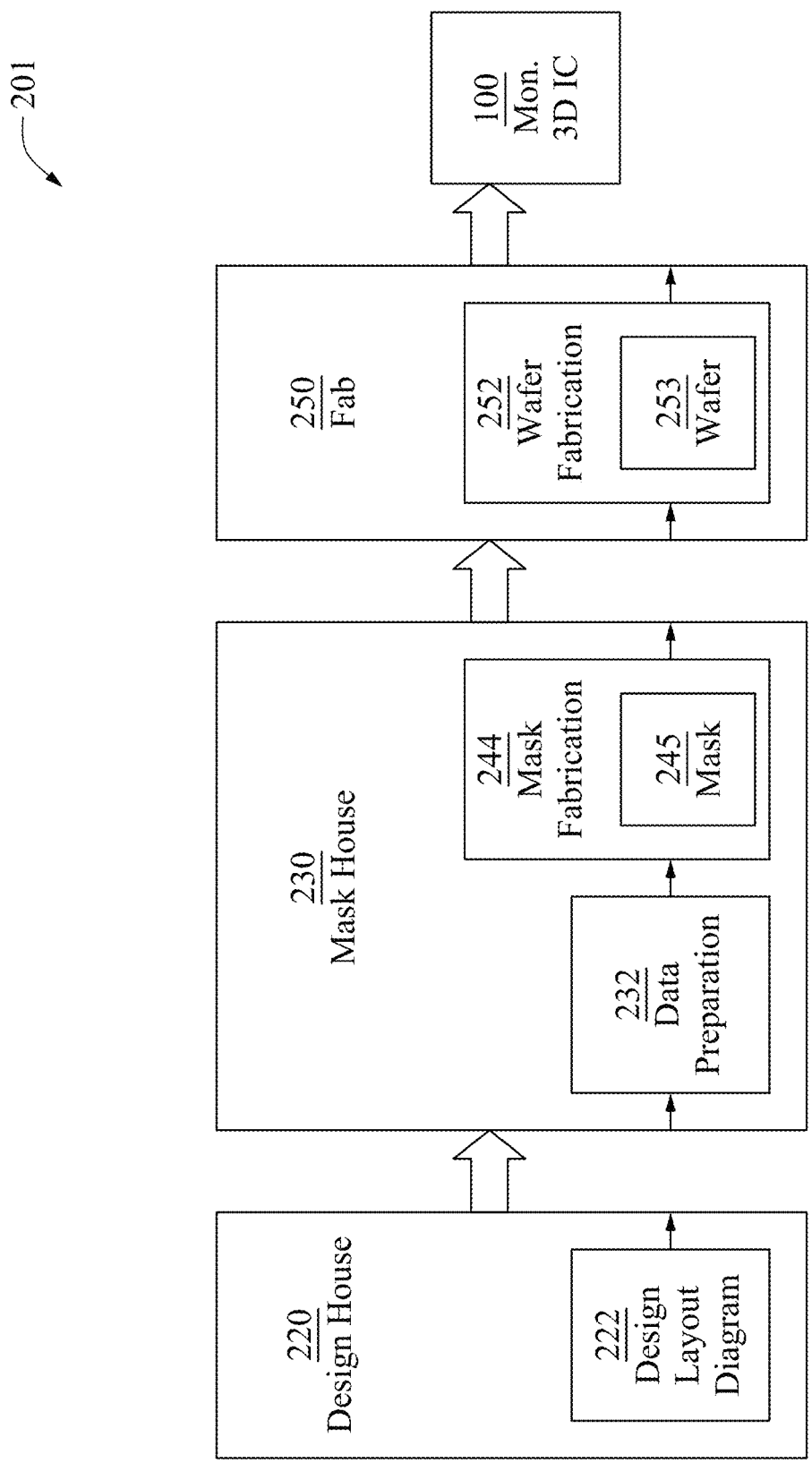
FIG. 6 is a block diagram of an IC manufacturing system and an IC manufacturing flow associated therewith in accordance with some embodiments.

In FIG. 6, the IC manufacturing system 201 includes entities, such as a design house 220, a mask house 230, and an IC manufacturer/fabricator ("fab") 250, that interact with one another in the design, development, and manufacturing cycles and/or services related to manufacturing an Monolithic 3D IC 100, such as the devices 100-106 disclosed herein. The entities in the system 201 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of the design house 220, mask house 230, and IC fab 250 is owned by a single larger company. In some embodiments, two or more of design house 220, mask house 230, and IC fab 250 coexist in a common facility and use common resources.

The design house (or design team) 220 generates an IC design layout diagram 222. The IC design layout diagram 222 includes various geometrical patterns, or IC layout diagrams designed for an IC device, such as the monolithic 3D IC 100 discussed above. The geometrical patterns correspond to patterns of metal, oxide, or semiconductor layers that make up the various components of the monolithic 3D IC 100 to be fabricated. The various layers combine to form various IC features. For example, a portion of the IC design layout diagram 222 includes various IC features, such as an active region, gate electrode, source and drain, metal lines or local vias, and openings for bonding pads, to be formed in a semiconductor substrate (such as a silicon wafer) and various material layers disposed on the semiconductor substrate. The design house 220 implements a design procedure to form an IC design layout diagram 222. The design procedure includes one or more of logic design, physical design or place and route. The IC design layout diagram 222 is presented in one or more data files having information of the geometrical patterns. For example, IC design layout diagram 222 can be expressed in a GDSII file format or DFII file format.

The mask house 230 includes a data preparation 232 and a mask fabrication 244. The mask house 230 uses the IC design layout diagram 222 to manufacture one or more masks 245 to be used for fabricating the various layers of the monolithic 3D IC 100 according to the IC design layout diagram 222. The mask house 230 performs mask data preparation 232, where the IC design layout diagram 222 is translated into a representative data file ("RDF"). The mask data preparation 232 provides the RDF to the mask fabrication 244. The mask fabrication 244 includes a mask writer. A mask writer converts the RDF to an image on a substrate, such as a mask (reticle) 245 or a semiconductor wafer 253. The design layout diagram 222 is manipulated by the mask data preparation 232 to comply with particular characteristics of the mask writer and/or requirements of the IC fab 250. In FIG. 6, the mask data preparation 232 and the mask fabrication 244 are illustrated as separate elements. In some embodiments, the mask data preparation 232 and the mask fabrication 244 can be collectively referred to as a mask data preparation.

In some embodiments, the mask data preparation 232 includes an optical proximity correction (OPC) which uses lithography enhancement techniques to compensate for image errors, such as those that can arise from diffraction, interference, other process effects and the like. The OPC adjusts the IC design layout diagram 222. In some embodiments, the mask data preparation 232 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, the mask data preparation 232 includes a mask rule checker (MRC) that checks the IC design layout diagram 222 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 222 to compensate for limitations during the mask fabrication 244, which may undo part of the modifications performed by OPC in order to meet mask creation rules.

In some embodiments, the mask data preparation 232 includes lithography process checking (LPC) that simulates processing that will be implemented by the IC fab 250 to fabricate the Monolithic 3D IC 100. LPC simulates this processing based on the IC design layout diagram 222 to create a simulated manufactured device, such as the monolithic 3D IC 100. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine the IC design layout diagram 222.

It should be understood that the above description of mask data preparation 232 has been simplified for the purposes of clarity. In some embodiments, data preparation 232 includes additional features such as a logic operation (LOP) to modify the IC design layout diagram 222 according to manufacturing rules. Additionally, the processes applied to the IC design layout diagram 222 during data preparation 232 may be executed in a variety of different orders.

After the mask data preparation 232 and during the mask fabrication 244, a mask 245 or a group of masks 245 are fabricated based on the modified IC design layout diagram 222. In some embodiments, the mask fabrication 244 includes performing one or more lithographic exposures based on the IC design layout diagram 222. In some embodiments, an electron-beam (e-beam) or a mechanism of multiple e-beams is used to form a pattern on a mask (photomask or reticle) 245 based on the modified IC design layout diagram 222. The mask 245 can be formed in various technologies. In some embodiments, the mask 245 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of the mask 245 includes a transparent substrate (e.g., fused quartz) and an opaque material (e.g., chromium) coated in the opaque regions of the binary mask. In another example, the mask 245 is formed using a phase shift technology. In a phase shift mask (PSM) version of the mask 245, various features in the pattern formed on the phase shift mask are configured to have proper phase difference to enhance the resolution and imaging quality. In various examples, the phase shift mask can be attenuated PSM or alternating PSM. The mask(s) generated by the mask fabrication 244 is used in a variety of processes. For example, such a mask(s) is used in an ion implantation process to form various doped regions in the semiconductor wafer 253, in an etching process to form various etching regions in the semiconductor wafer 253, and/or in other suitable processes.

The IC fab 250 includes wafer fabrication 252. The IC fab 250 is an IC fabrication business that includes one or more manufacturing facilities for the fabrication of a variety of different IC products. In some embodiments, the IC Fab 250 is a semiconductor foundry. For example, there may be a manufacturing facility for the front end fabrication of a plurality of IC products (FEOL fabrication), while a second manufacturing facility may provide the back end fabrication for the interconnection and packaging of the IC products (BEOL fabrication), and a third manufacturing facility may provide other services for the foundry business.

The IC fab 250 uses mask(s) 245 fabricated by the mask house 230 to fabricate the monolithic 3D IC 100. Thus, the IC fab 250 at least indirectly uses the IC design layout diagram 222 to fabricate the Monolithic 3D IC 100. In some embodiments, the semiconductor wafer 253 is fabricated by the IC fab 250 using mask(s) 245 to form the Monolithic 3D IC 100. In some embodiments, the IC fabrication includes performing one or more lithographic exposures based at least indirectly on the IC design layout diagram 222. The Semiconductor wafer 253 includes a silicon substrate or other proper substrate having material layers formed thereon. The semiconductor wafer 253 further includes one or more of various doped regions, dielectric features, multilevel interconnects, and the like (formed at subsequent manufacturing steps).

Figure 7:
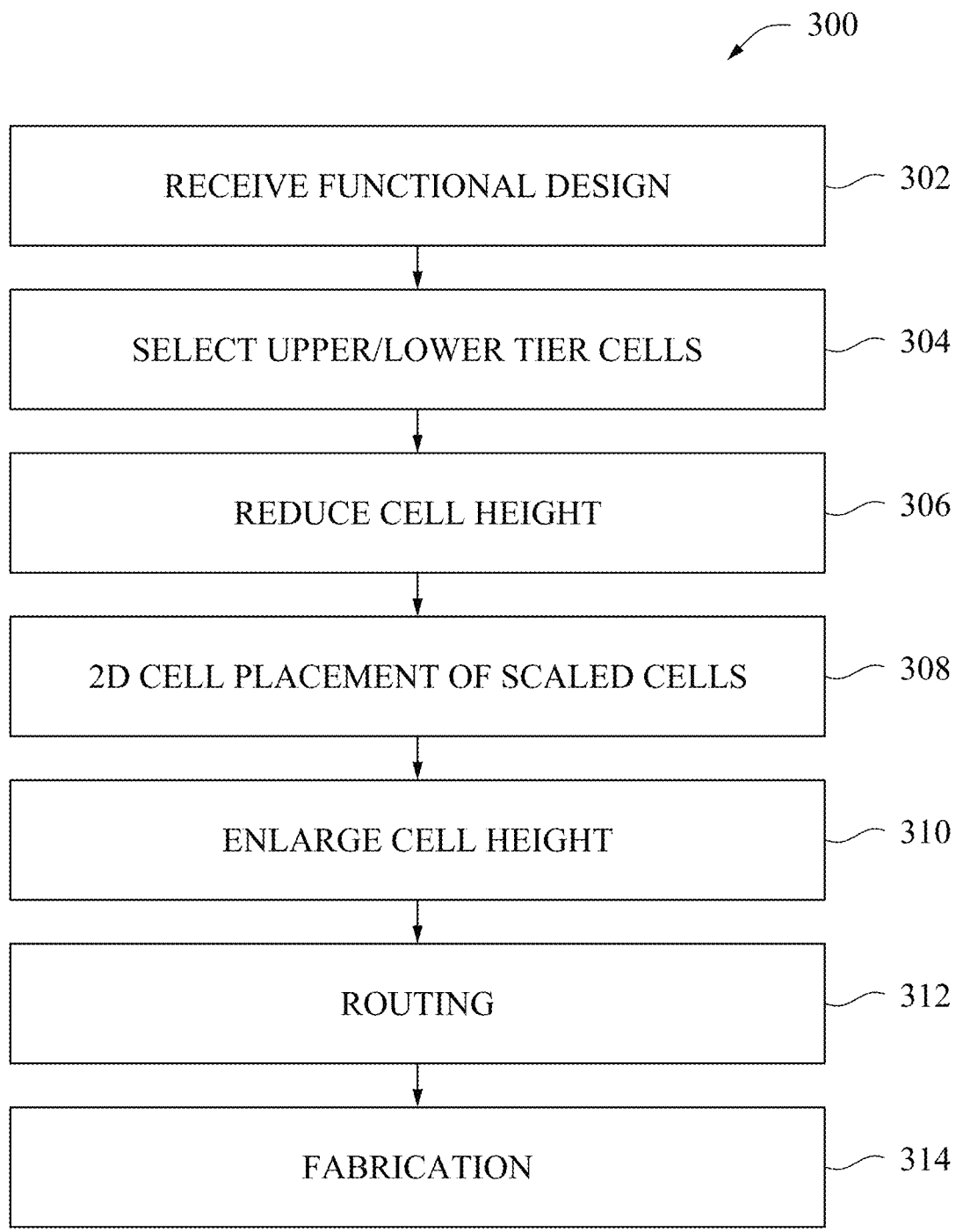
FIG. 7 is a flow diagram illustrating an example of a method for creating a monolithic 3D IC design layout in accordance with some embodiments.

FIG. 7 illustrates an example of a method 300 for creating a monolithic 3D IC design layout in accordance with aspects of the present disclosure. The 300 may be implemented by the EDA system 200 discussed above. The illustrated method 300 includes receiving a functional design for the monolithic 3D IC to be produced in step 302. Based on the received design, a first plurality of lower tier cells and a second plurality of upper tier cells are selected in step 304. The selected cells have a cell height CH. In some embodiments, the cell height CH is less than 200 nm. For instance, in some implementations the CH is 169 nm. In general, cells are selected in the upper or lower tier according to $$\overset{Top\ Tier}{\underset{j=1}{\sum}} \text{Cell\_area}_j + (SpaceConstrain * CH)_j \leq \overset{Bottom\ Tier}{\underset{k=1}{\sum}} \text{Cell\_area}_k$$

In other words, the total top tier area including the cell area and space constraint for provision of spaces for MIV placement is equal to or less than the lower tier area, which includes the lower tier cell area.

At step 306, the cell height CH is reduced by a predetermined scaling factor such that the cell height CH is scaled to a different, scaled cell height $CH_S$. In some implementations, the scaling factor is 0.5. In other words, the cell height CH is reduced by half, which can be expressed as 0.5 CH. Thus, for purposes of placing the cells in cell layouts for the lower tier 102 and the upper tier 112, the cell height CH is reduced by half to the scaled cell height $CH_S$ in the example of FIG. 7. In other embodiments, other scaling factors may be employed.

The selected cells at the scaled cell height $CH_S$ are then placed in respective 2D layouts for the lower tier 102 and the upper tier 114 in step 308. As noted above, upper tier space available for cell placement is constrained due to the provision of the lateral spaces 110 between upper tier cells for MIV placement. Provision of the space(s) 110 reduces the available upper tier layout area available for cell placement, and as such, in some embodiments the number of cells placed on the upper tier 112 is less than the number of cells placed on the lower tier 102. Thus, as the size of the space(s) 110 increases, the upper tier layout space available for upper tier cells 114 is reduced.

Figure 8:
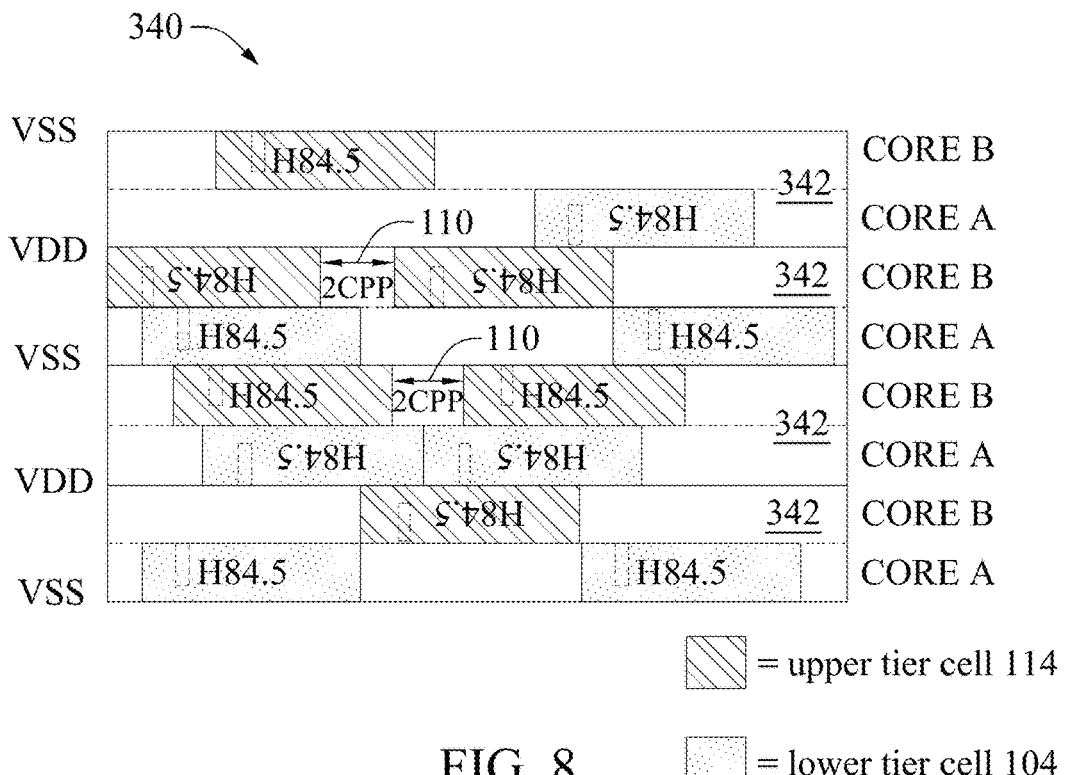
FIG. 8 is an IC layout including an example cell placement corresponding to a step of the method of FIG. 7.

FIG. 8 illustrates an IC layout or floorplan 340 including an example cell placement corresponding to step 308 of FIG. 7. The floorplan 340 has a plurality of rows 342, each of which include a power and ground (PG) rails VSS and VDD, with a core area therebetween. In the layout 340, each of the core areas is divided into a lower tier core A and an upper tier core B. In the illustrated example, the cells selected in step 304 have CH=169 nm. Thus, as scaled in step 306, the cells have a reduced or scaled cell height $CH_S$ of 84.5 nm (i.e. 0.5×169). A first plurality of the lower tier cells 104 are thus placed in the lower tier core B area of the rows 342, while a second plurality of the upper tier cells 114 are placed in the upper tier core A area of the rows 342. Moreover, spaces 110 having a predetermined 2CPP spacing, for example, laterally separate some of the adjacent upper tier cells 114.

Figure 9:
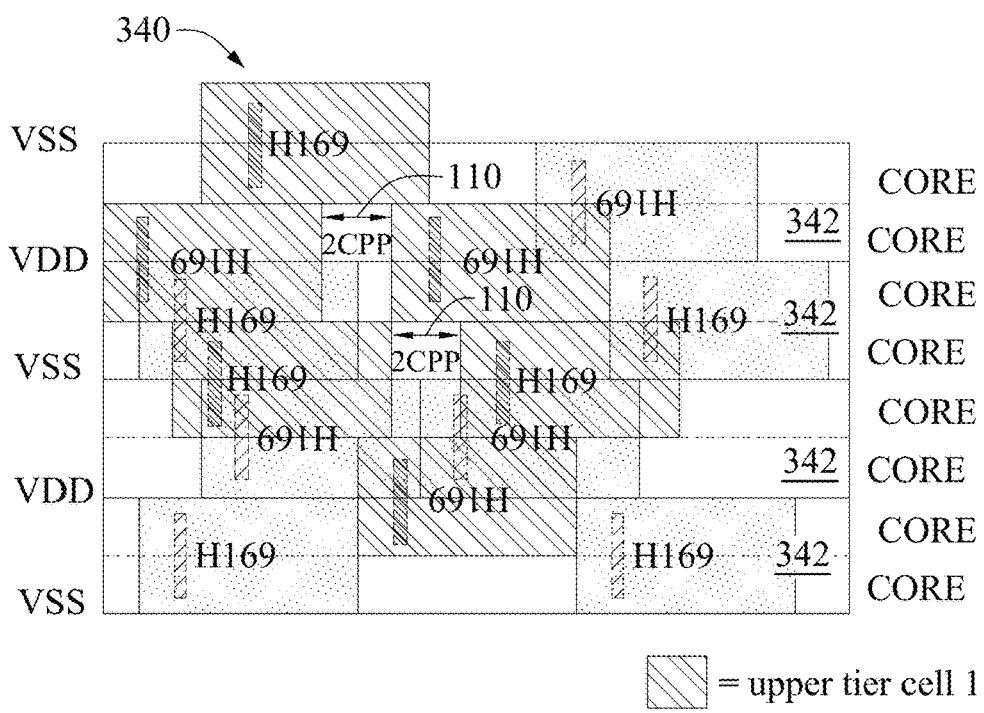
FIG. 9 is another IC layout including an example cell placement corresponding to another step of the method of FIG. 7.
Figure 10:
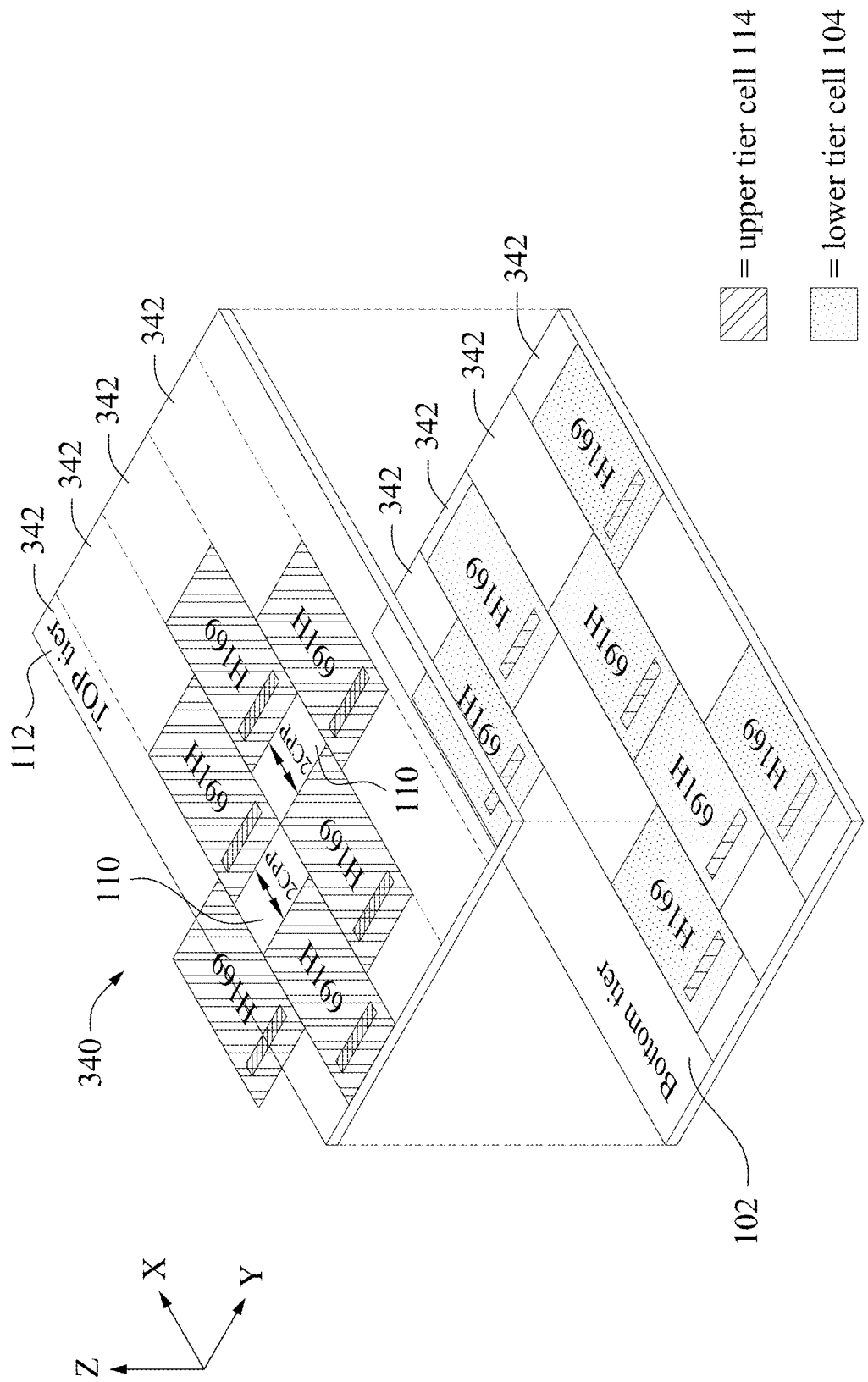
FIG. 10 is a perspective view of an example IC layout showing upper and lower tiers of a monolithic 3D IC in accordance with some embodiments.

Referring back to FIG. 7, after the 2D cell placement for the lower and upper tiers 102 and 112 in step 308, the cells are enlarged from the scaled cell height $CH_S$ to their original cell height CH in step 310. In other words, the inverse of the scaling factor is applied to the scaled cell height $CH_S$ to return the cell height to the original cell height CH. FIG. 9 illustrates the floorplan 340 with the cells scaled back to their original cell height CH, which is 169 nm in the illustrated example. FIG. 10 is a perspective view of the floorplan 340 showing the upper and lower tiers 102 and 112 separated in the Z (vertical) direction.

Referring back to FIG. 7, in step 312 conductive routings for the lower and upper tier cells 104 and 114 are determined by the EDA system 200. This may include, for example, determining the various routing and connections of the MLI structures 106 and 116 shown in FIGS. 1 and 2 for interconnections of the various cells and PG connections. At step 314, the monolithic 3D IC 100 may be fabricated according to the generated design as discussed in conjunction with FIGS. 5 and 6 above.

Among other things, the routing step 312 may include determining routing and connections of the lower tier metal layers M0-M3 and the lower tier local vias 108 for electrical interconnections of the lower tier cells 104 and lower tier PG connections, as well as determining routing and connections of the upper tier metal layers M4-M6 and the upper tier local vias 118 for electrical interconnections of the upper tier cells 114 and upper tier PG connections.

Still further, routing and connections of the MIVs 120 may be determined in step 312 for inter-tier connections. As noted above with the disclosure of FIGS. 1-4, different upper tier routings may be employed in various embodiments for inter-tier connections by the MIVs 120. As shown in FIGS. 1 and 3, the MIV 120 may directly connect between the M3 metal layer (i.e. the uppermost metal layer of the lower tier 102) to the M4 metal layer (i.e. the lowest metal layer of the upper tier 112). In FIGS. 1 and 2, top tier local routing of the M4 metal layer provides a direct connection between the MIV 120 and the upper tier cell 114. In FIGS. 3 and 4, the M4 metal layer connection to the MIV 120 is then routed through upper tier local vias 118 and additional upper tier metal layers M5 and M6 to connect to the upper tier cell 114.

Figure 11:
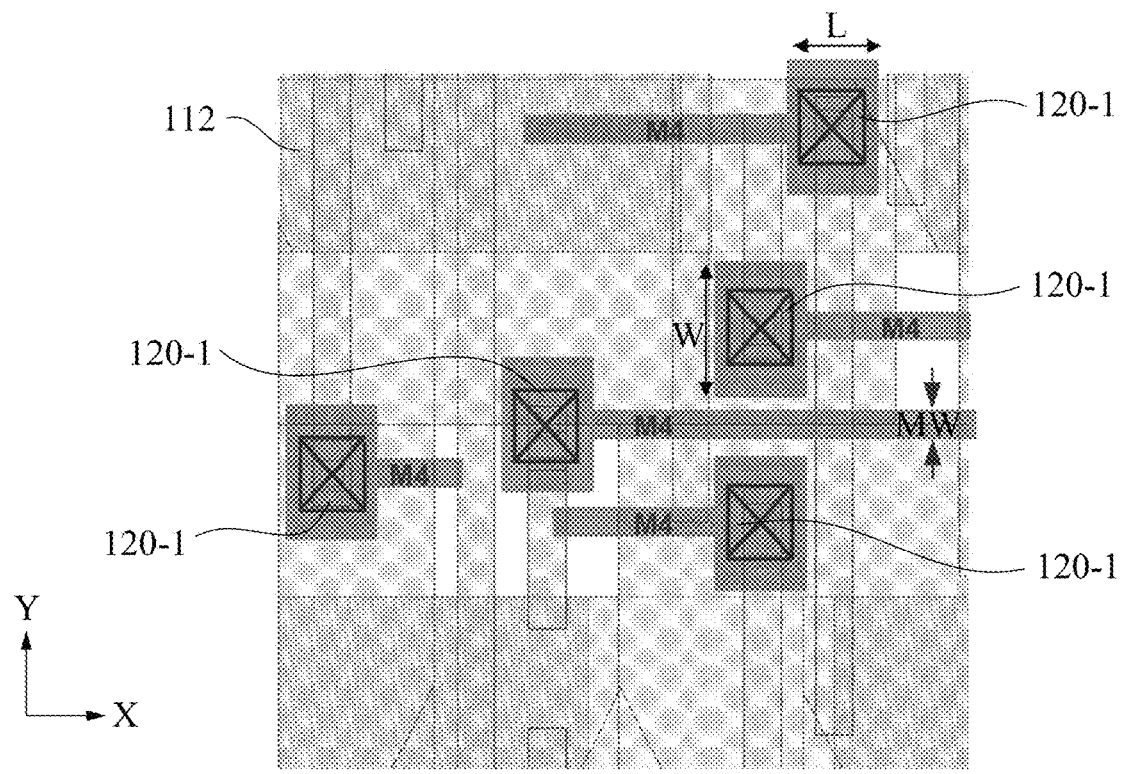
FIG. 11 is a top view illustrating a portion of an upper tier of a monolithic 3D IC showing aspects of a monolithic inter-tier via (MIV) in accordance with some embodiments.

As noted above, the cell height is less than 200 nm in some implementations, and in the example discussed above the cell height CH is 169 nm. The MIV size impacts the upper tier 114 space available for upper tier cell placement. For instance, in some examples the MIV 120 is a pillar having a rectangular (or square) cross section including a length dimension L and a width dimension W. FIG. 11 is a top view illustrating a portion of the upper tier 112, showing conductive stripes of the M4 metal layer connected to a plurality of rectangular MIVs 120-1. In some examples, the length L and width W dimensions are expressed in terms of contact poly pitch (CPP). In some examples disclosed above, the spaces 110 defined by the upper tier 114 through which the MIVs 120 extend is 2CPP, while other examples have a 3CPP space 120. The MIV 120-1 length L and/or width W dimensions are from 0.5 to 1.1 CPP in some examples. In other embodiments, the length L and width W dimensions are expressed in terms of the cell height CH. For instance, the MIV length L and/or width W dimensions range from about 0.25 CH to 0.5 CH. In other examples, the MIV length L and/or width W dimensions are about 0.3 CH.

Figure 12:
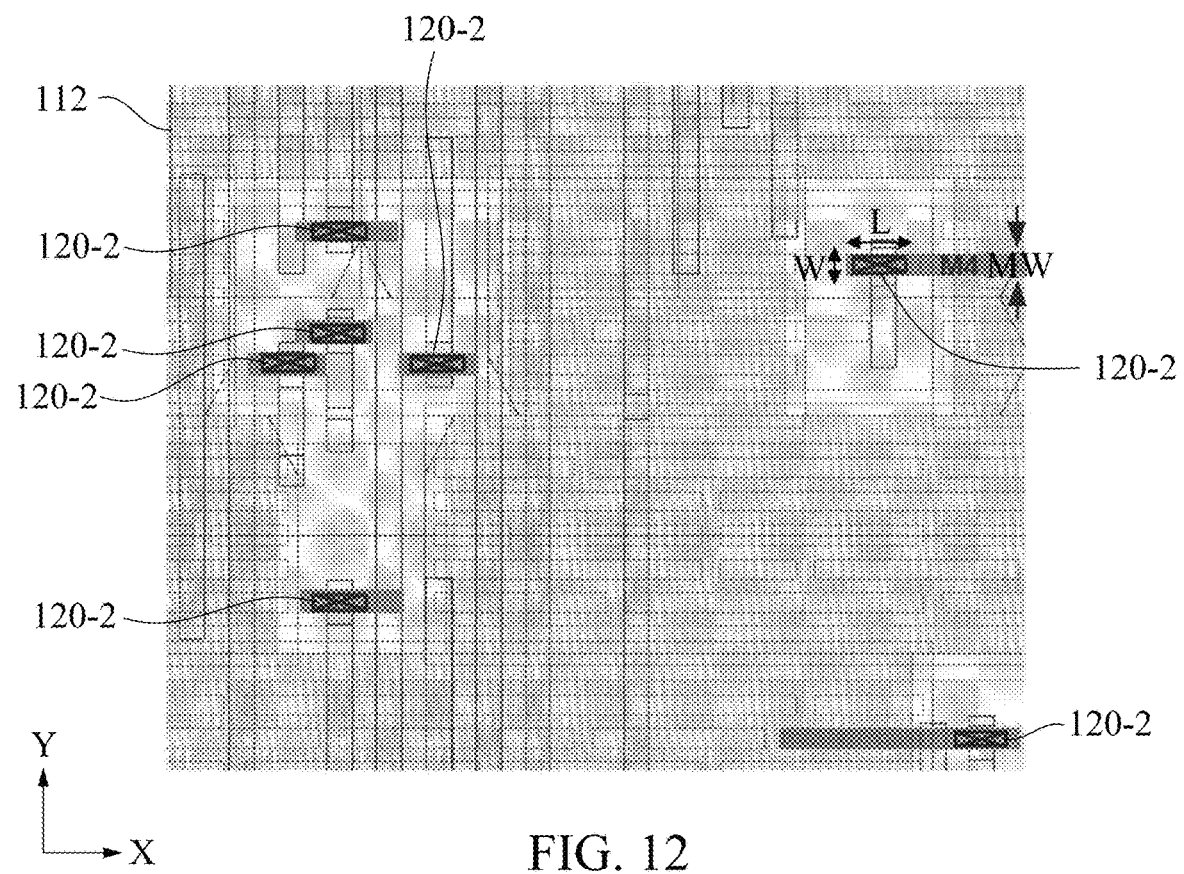
FIG. 12 is a top view illustrating a portion of an upper tier of a monolithic 3D IC showing aspects of another MIV in accordance with some embodiments.

FIG. 12 illustrates another example of a portion of the upper tier 112, where MIVs 120-2 have a slot cross section shape including the length dimension L and the width dimension W. In FIG. 12, the length L and width W dimensions may be determined in terms of the metal width MW of the metal layer (i.e. the conductive stripe) connecting to the MIV 120-2, for example. In the example of FIG. 12, the slot MIV 120-2 width W dimension is the metal width MW, while the MIV length L is 1.5 MW to 2.5 MW.

Figure 13A:
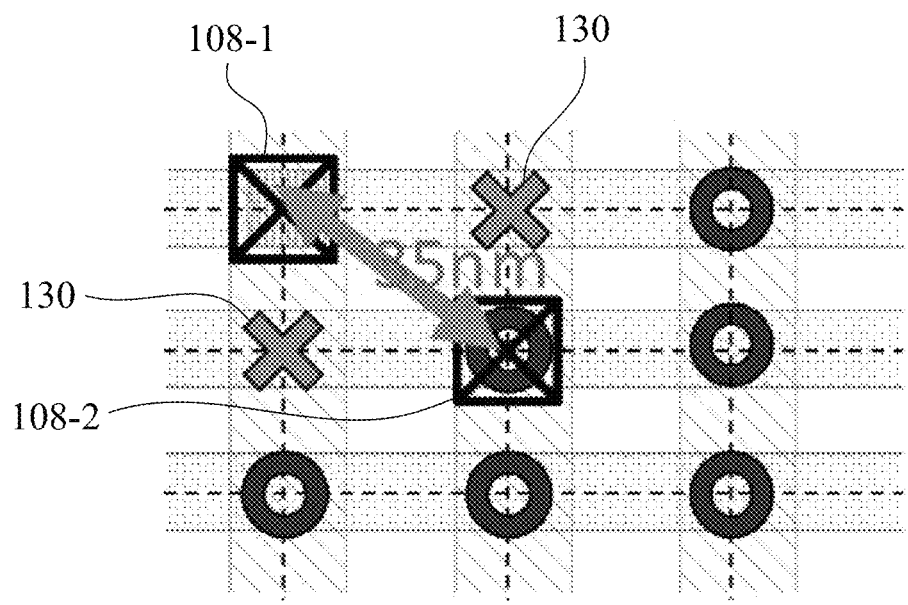
FIGS. 13A and 13B illustrate examples of MIV center-to-center pitch arrangements in accordance with some embodiments.
Figure 13B:
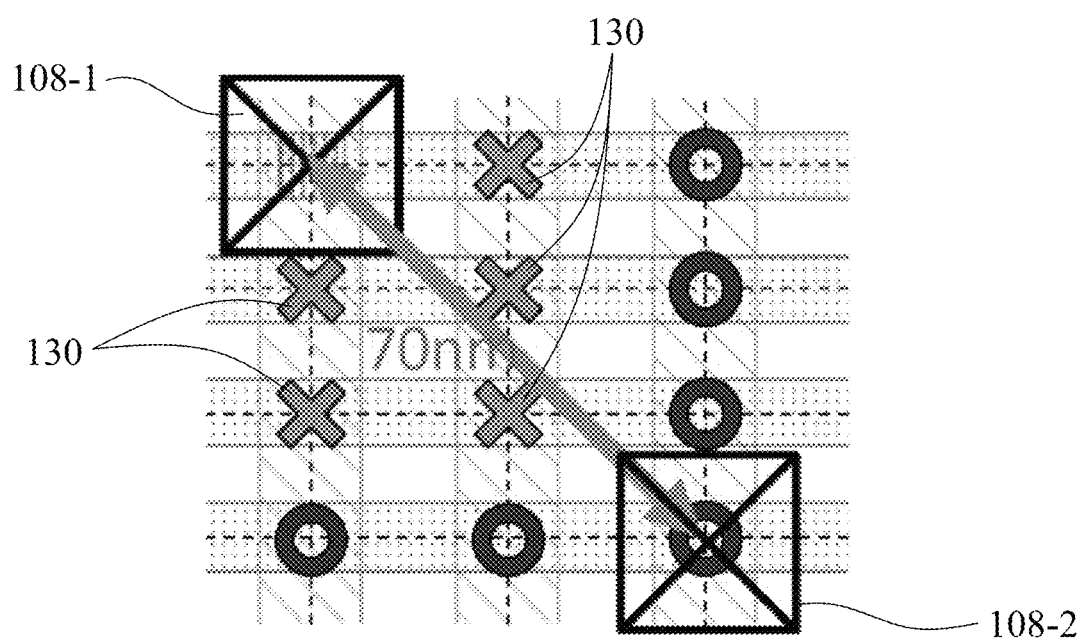

Further, in examples having a cell height less than 200 nm (e.g. 169 nm as discussed above), some embodiments have an MIV center-to-center pitch of about 30 nm to 76 nm to maintain a desired MIV density for signal routing between the lower and upper tiers. FIG. 13B illustrates an example where the MIVs have a center-to-center pitch of 35 nm. Thus, the distance between a first MIV 108-1 and a second MIV 108-2 is 35 nm, resulting in forbidden areas 130 where MIVs may not be placed to maintain the 35 nm pitch. Increasing the center-to-center pitch to 70 nm as shown in FIG. 13B results in additional forbidden areas 130 where MIVs may not be located. As the center-to-center pitch increases, the area utilization decreases due to the additional forbidden areas 130.

Figure 14:
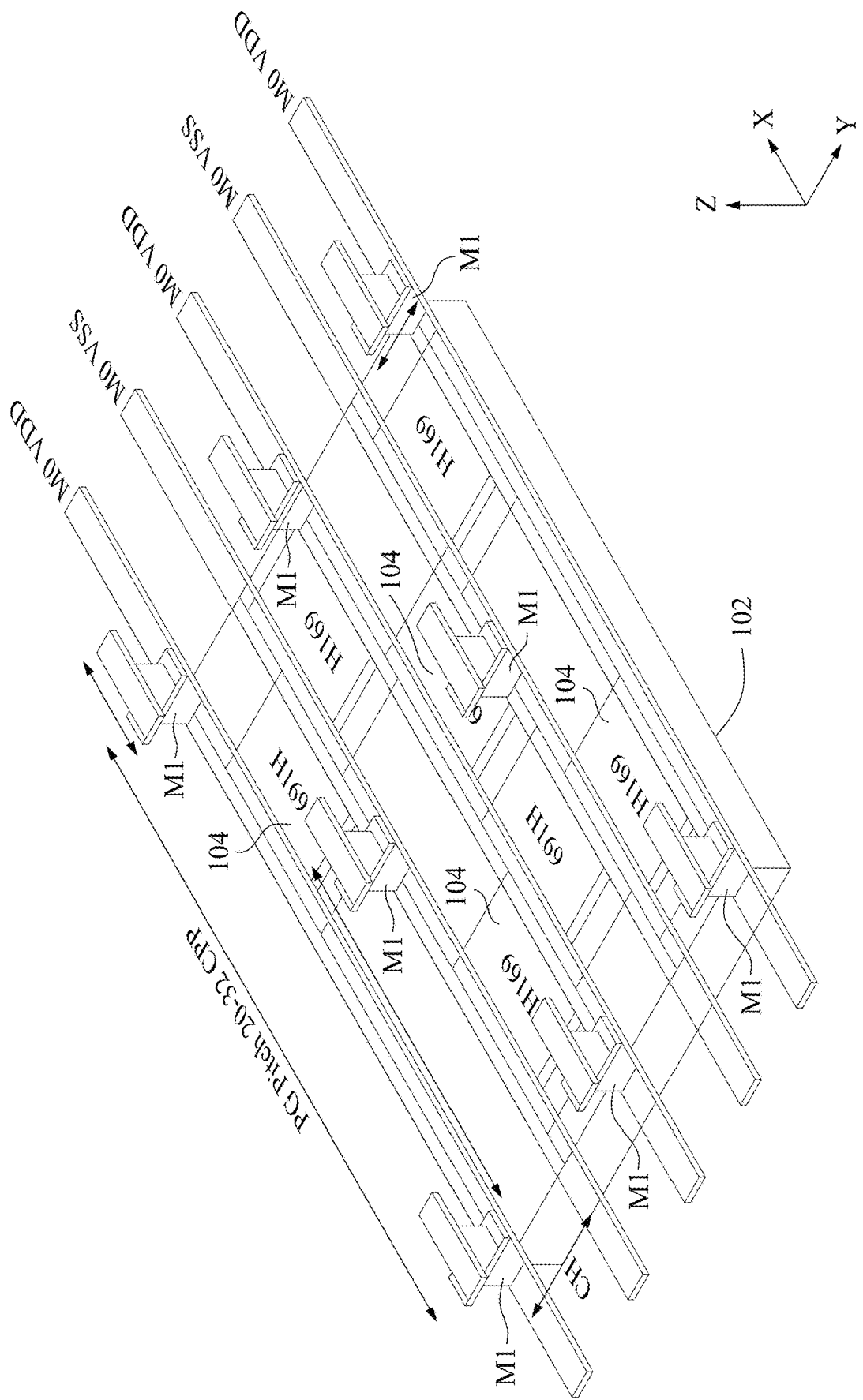
FIG. 14 is a perspective view illustrating portions of a monolithic 3D IC in accordance with some embodiments.

The routing step 312 of FIG. 7 further may include connecting the lower tier cells 102 and upper tier cells 112 to the VSS and VDD lines of the PG structure. Various metal layers of the MLI structures 106 and 116 may define different shapes and extend in different directions to make the desired connections between the cells 104 and 114 and between the lower tier 102 and the upper tier 112. FIG. 14 illustrates examples of portions of the lower tier 102, including lower tier cells 104, and lower tier metal layers M0, M1, and M2. Conductive stripes of the M0 layer are shown that extend along an X direction and provide connections to VSS and VDD power rails. The full PG pitch (i.e. VDD to VDD connection or VSS to VSS connection) is 20CPP to 32CPP in the illustrated example, while the half PG pitch (i.e. VDD to VSS) is 0 to 16CPP. The M1 metal layer includes M1 pillars that have a length of 0.25 CH to 0.45 CH, and the M2 metal layer includes M2 pillars that have a 2CPP to 4CPP length.

Figure 15:
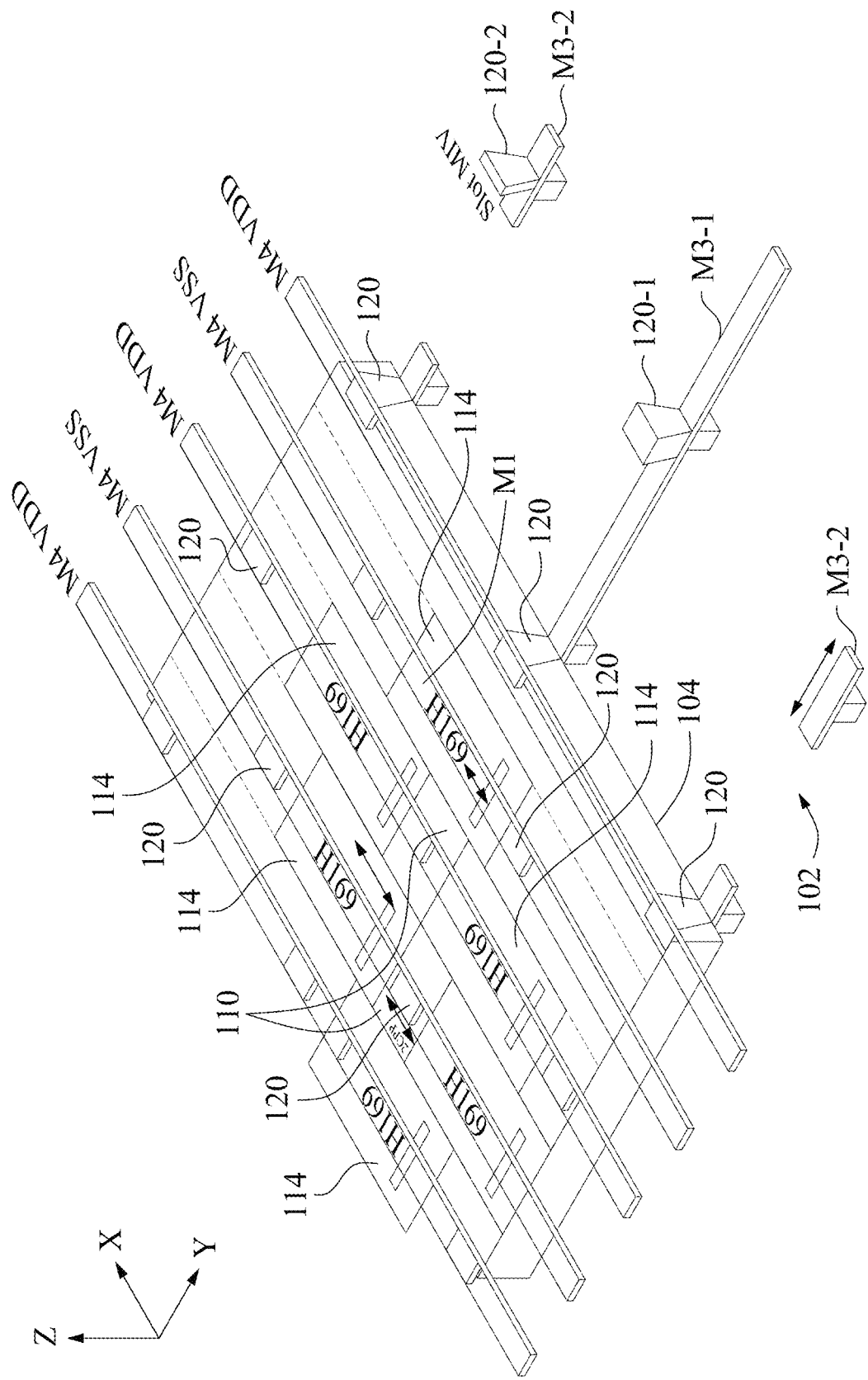
FIG. 15 is a perspective view illustrating further portions a monolithic 3D IC in accordance with some embodiments.

FIG. 15 illustrates examples of aspects of the conductive connections of the upper tier 112 in accordance with some embodiments. The upper tier cells 114 are arranged in the upper tier 112, with cells 114 that are adjacent to each other in the X direction being laterally separated by the 2CPP spaces 110. The MIVs 120 extend through the spaces 110. The PG structure includes conductive stripes of the upper tier M4 metal layer, which are connected to upper ends of the MIVs 120. The lower ends of the MIVs 120 are connected to the M3 metal layer of the lower tier 102. In various embodiments the lower tier M3 metal layer includes conductive stripes M3-1 and/or conductive pillars M3-2. M3 metal layer pillars M3-2 may have a pillar length of 0.5 CH to CH. As noted above, the MIVs may define a rectangular pillar 120-1 as disclosed in conjunction with FIG. 11 or a slot 120-2 as disclosed in conjunction with FIG. 12.

Disclosed embodiments thus provide a monolithic 3D IC that has an upper tier arrangement that facilitates placement of MIVs that connects lower tier and upper tier cells. In some examples, the upper tier arrangement includes predetermined spaces between upper tier cells through which the MIVs extend. Moreover, a placement flow for the monolithic 3D IC may be implemented with typical EDA tools by generating 2D placements for the lower and upper tiers.

In accordance with some embodiments, a monolithic 3D IC device includes a lower tier including a lower tier cell and an upper tier arranged over the lower tier. The upper tier has a first upper tier cell and a second upper tier cell separated by a predetermined lateral space. A MIV extends from the lower tier through the predetermined lateral space. The MIV has a first end electrically connected to the lower tier cell and a second end electrically connected to the first upper tier cell.

In accordance with further embodiments, a method includes selecting a first plurality of lower tier cells that each have a first cell height, and a second plurality of upper tier cells that have the first cell height. The first cell height is reduced by a predetermined scaling factor such that the first cell height is scaled to a second cell height. The scaled first plurality of lower tier cells are place on a lower tier, and the scaled second plurality of upper tier cells are placed on an upper tier over the lower tier. At least two of the upper tier cells are laterally separated by a predetermined lateral space. The second cell height is enlarged to the first cell height after the scaled first plurality of lower tier cells are placed on the lower tier and the scaled second plurality of upper tier cells are placed on the upper tier. Conductive routings are determined for the first plurality of lower tier cells and the second plurality of upper tier cells.

In accordance with still further disclosed aspects, a system has a processor and computer readable media accessible by the processor. The computer readable media stores a cell library defining a plurality of cells and instructions that when executed by the processor implement a method that includes receiving an integrated circuit design, and selecting first and second pluralities of cells based on the integrated circuit design. A 2D layout of the first plurality of cells for a lower tier of a monolithic 3D IC is determined. Further, a 2D layout of the second plurality of cells and a plurality of predetermined open spaces for an upper tier of the monolithic 3D IC is determined. First conductive routings for the 2D layout of the first plurality of cells are determined, and second conductive routings for the 2D layout of the second plurality of cells are determined. The method further includes determining a conductive connection of the first conductive routings and the second conductive routings with a MIV that extends through at least one of the predetermined open spaces.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A monolithic three-dimensional (3D) integrated circuit (IC) device, comprising:
    a lower tier including a lower tier cell;
    an upper tier arranged over the lower tier, the upper tier including a first upper tier cell and a second upper tier cell separated by a predetermined lateral space; and
    a monolithic inter-tier via (MIV) extending from the lower tier through the predetermined lateral space, the MIV having a first end electrically connected to the lower tier cell and a second end electrically connected to the first upper tier cell, wherein the predetermined lateral space is at least two contact poly pitch (2CPP).

2. The monolithic 3D IC device of claim 1, further comprising:
    a first lower tier metal layer electrically connected to the lower tier cell,
    a first upper tier metal layer electrically connected to the first upper tier cell;
    wherein the first end of the MIV is electrically connected to the first lower tier metal layer and the second end of the MIV is electrically connected to the first upper tier metal layer.

3. The monolithic 3D IC device of claim 2, wherein the first end of the MIV is directly connected to the first lower tier metal layer and the second end of the MIV is directly connected to the first upper tier metal layer.

4. The monolithic 3D IC device of claim 3, further comprising:
    a second lower tier metal layer directly connected to the lower tier cell; and
    a lower tier local via electrically connecting the first and second lower tier metal layers.

5. The monolithic 3D IC device of claim 3, wherein the first upper tier metal layer is directly connected to the first upper tier cell.

6. The monolithic 3D IC device of claim 4, further comprising:
    a second upper tier metal layer;
    a first upper tier local via electrically connecting the MIV to the second upper tier metal layer; and
    a second upper tier local via electrically connecting the first upper tier cell to the second upper tier metal layer.

7. The monolithic 3D IC device of claim 1, wherein the MIV is a pillar having a rectangular cross section including a length dimension L and a width dimension W, wherein the lower tier cell and the upper tier cell each have a cell height CH, and wherein $L \leq 0.3 CH$.

8. The monolithic 3D IC device of claim 7, wherein the MIV has a square cross section.

9. The monolithic 3D IC device of claim 7, further comprising:
    a first upper tier metal layer electrically connected to the first upper tier cell, the first upper tier metal layer including a conductive strip defining a metal width MW, wherein $1.5\ MW \leq L \leq 2.5\ MW$.

10. The monolithic 3D IC device of claim 7, wherein the CH is less than 200 nm.

11. The monolithic 3D IC device of claim 1, wherein the predetermined lateral space is at least three contact poly pitch (3CPP).

12. The monolithic 3D IC device of claim 1, further comprising:
    a first plurality of lower tier cells including the lower tier cell;
    a second plurality of upper tier cells including the first and second upper tier cells;
    wherein the second plurality of upper tier cells is less than the first plurality of lower tier cells.

13. A monolithic three-dimensional (3D) integrated circuit (IC) device, comprising:
    a lower tier including a lower tier cell;
    a first lower tier metal layer electrically connected to the lower tier cell;
    an upper tier arranged over the lower tier, the upper tier including a first upper tier cell and a second upper tier cell separated by a predetermined lateral space;
    a first upper tier metal layer directly connected to the first upper tier cell;

a monolithic inter-tier via (MIV) extending from the lower tier through the predetermined lateral space, the MIV having a first end directly connected to the first lower tier metal layer;

a second upper tier metal layer;

a first upper tier local via electrically connecting the MIV to the second upper tier metal layer; and a second upper tier local via electrically connecting the first upper tier cell to the second upper tier metal layer.

14. The monolithic 3D IC device of claim 13, further comprising:

a second lower tier metal layer directly connected to the lower tier cell; and a lower tier local via electrically connecting the first and second lower tier metal layers.

15. The monolithic 3D IC device of claim 13, wherein the MIV is a pillar having a rectangular cross section including a length dimension L and a width dimension W, wherein the lower tier cell and the upper tier cell each have a cell height CH, and wherein $L \leq 0.3 CH$.

16. The monolithic 3D IC device of claim 15, wherein the MIV has a square cross section.

17. The monolithic 3D IC device of claim 15, wherein the first upper tier metal layer electrically includes a conductive strip defining a metal width MW, wherein $1.5 MW \leq L \leq 2.5 MW$.

18. A monolithic three-dimensional (3D) integrated circuit (IC) device, comprising:

a lower tier including a lower tier cell;

a first lower tier metal layer electrically connected to the lower tier cell;

an upper tier arranged over the lower tier, the upper tier including a first upper tier cell and a second upper tier cell separated by a predetermined lateral space;

a first upper tier metal layer electrically connected to the first upper tier cell;

a monolithic inter-tier via (MIV) extending from the lower tier through the predetermined lateral space, the MIV having a first end electrically connected to the first lower tier metal layer and a second end electrically connected to the first upper tier metal layer, wherein the MIV is a pillar having a rectangular cross section including a length dimension L and a width dimension W;

a second upper tier metal layer; and a first upper tier local via electrically connecting the first upper tier cell to the second upper tier metal layer.

19. The monolithic 3D IC device of claim 18, further comprising:

a second lower tier metal layer electrically connected to the lower tier cell; and a lower tier local via electrically connecting the first lower tier metal layer and the second lower tier metal layer.

20. The monolithic 3D IC device of claim 18, wherein the lower tier cell and the upper tier cell each have a cell height CH and $L \leq 0.3 CH$.

* * * * *